(12) United States Patent
Han et al.

(10) Patent No.: US 10,513,631 B2
(45) Date of Patent: Dec. 24, 2019

(54) COMPOSITION FOR WINDOW FILM, FLEXIBLE WINDOW FILM FORMED THEREFROM, AND FLEXIBLE DISPLAY DEVICE COMPRISING SAME

(71) Applicants: SAMSUNG SDI CO., LTD., Yongin-si, Gyeonggi-do (KR); SAMSUNG ELECTRONICS CO., LTD., Suwon-si, Gyeonggi-do (KR)

(72) Inventors: Dong Il Han, Suwon-si (KR); Kyoung Ku Kang, Suwon-si (KR); Min Hye Kim, Suwon-si (KR); Ji Hwan Park, Suwon-si (KR); Chang Soo Woo, Suwon-si (KR); Ji Sun Im, Suwon-si (KR); Seung Woo Jang, Suwon-si (KR)

(73) Assignees: Samsung SDI Co., Ltd., Yongin-si (KR); Samsung Electronics Co., Ltd., Suwon-si (KR)

( * ) Notice: Subject to any disclaimer, the term of this patent is extended or adjusted under 35 U.S.C. 154(b) by 133 days.

(21) Appl. No.: 15/561,945

(22) PCT Filed: Apr. 22, 2016

(86) PCT No.: PCT/KR2016/004227
§ 371 (c)(1),
(2) Date: Sep. 26, 2017

(87) PCT Pub. No.: WO2016/175510
PCT Pub. Date: Nov. 3, 2016

(65) Prior Publication Data
US 2018/0112105 A1    Apr. 26, 2018

(30) Foreign Application Priority Data
Apr. 30, 2015  (KR) .................. 10-2015-0062126

(51) Int. Cl.
C09D 183/06    (2006.01)
G02B 1/14      (2015.01)
(Continued)

(52) U.S. Cl.
CPC ........... C09D 183/06 (2013.01); C08G 77/14 (2013.01); C08G 77/38 (2013.01); C08J 3/24 (2013.01);
(Continued)

(58) Field of Classification Search
CPC ........... C09D 183/06; G02B 1/14; G06F 3/04; C08G 77/14; C08G 77/38; C08J 73/24;
(Continued)

(56) References Cited

U.S. PATENT DOCUMENTS 6,210,790 B1    4/2001  Crivello
2014/0132892 A1*  5/2014  Ko .......................... H01L 33/56
                                                                349/69

FOREIGN PATENT DOCUMENTS

JP    2000-328000    11/2000
JP    2007-176542    7/2007
(Continued)

OTHER PUBLICATIONS

International Search Report, corresponding to PCT/KR2016/004227, dated Jul. 21, 2016, 4 pages.

*Primary Examiner* — Ruiyun Zhang
(74) *Attorney, Agent, or Firm* — Lewis Roca Rothgerber Christie LLP (57) ABSTRACT

Provided are a composition for a window film, a flexible window film formed therefrom, and a flexible display device comprising same, the composition for a window film comprising: a first silicone resin comprising chemical formula 1; a second silicone resin containing a crosslinkable functional group and one or more among a Q unit and a bridge unit; a (Continued)

crosslinking agent; and an initiator. $(R^1SiO_{3/2})_x([R^2R^3SiO_{2/2}]_n)_y(R^4R^5SiO_{2/2})_z(R^6R^7R^8SiO_{1/2})_w$ (where $R^1$ is a crosslinkable functional group; $R^2$ and $R^3$ are each independently a methyl group; R4 and R5 are each independently hydrogen, a crosslinkable functional group, an unsubstituted or substituted C1-C20 alkyl group, or an unsubstituted or substituted C5-C20 cycloalkyl group; R6, R7, and R8 are each independently hydrogen, a crosslinkable functional group, an unsubstituted or substituted C1-C20 alkyl group, an unsubstituted or substituted C5-C20 cycloalkyl group, or an unsubstituted or substituted C6-C30 aryl group; n is an integer from 7 to 100; $0<x<1$, $0.01 \le y \le 0.6$, $0 \le z<1$, $0 \le w<1$, and $x+y+z+w=1$.

13 Claims, 3 Drawing Sheets

(51) Int. Cl.

| | | |
|---|---|---|
| *C08G 77/14* | (2006.01) | |
| *C08G 77/38* | (2006.01) | |
| *C08J 3/24* | (2006.01) | |
| *H01L 51/52* | (2006.01) | |
| *G06F 3/041* | (2006.01) | |
| *C08J 7/04* | (2006.01) | |
| *G06F 3/044* | (2006.01) | |
| *H01L 27/32* | (2006.01) | |
| *H01L 51/00* | (2006.01) | |

(52) U.S. Cl.
CPC ............... *C08J 7/047* (2013.01); *G02B 1/14* (2015.01); *G06F 3/041* (2013.01); *H01L 51/5246* (2013.01); *C08J 2367/02* (2013.01); *C08J 2383/06* (2013.01); *C08J 2483/04* (2013.01); *G06F 3/044* (2013.01); *G06F 2203/04102* (2013.01); *G06F 2203/04103* (2013.01); *H01L 27/323* (2013.01); *H01L 27/3276* (2013.01); *H01L 51/0097* (2013.01); *H01L 51/5281* (2013.01); *H01L 2251/5338* (2013.01)

(58) Field of Classification Search
CPC ...... C08J 7/04; C08J 2483/04; C08J 2483/06; C08J 2483/10; H01L 51/5246; H01L 27/323; H01L 2251/5338; Y10T 428/10; Y10T 428/1045; Y10T 428/1059
USPC ............... 428/1.1, 1.32, 1.5, 1.52, 331, 447; 427/515, 387
See application file for complete search history.

(56) References Cited

FOREIGN PATENT DOCUMENTS

| | | |
|---|---|---|
| KR | 10-2008-0002921 | 1/2008 |
| KR | 10-2010-0070349 | 6/2010 |
| KR | 10-2014-0004568 | 1/2014 |

* cited by examiner

COMPOSITION FOR WINDOW FILM, FLEXIBLE WINDOW FILM FORMED THEREFROM, AND FLEXIBLE DISPLAY DEVICE COMPRISING SAME

CROSS-REFERENCE TO RELATED APPLICATIONS

This Application is a National Phase Patent Application and claims priority to and the benefit of International Application Number PCT/KR2016/004227, filed on Apr. 22, 2016, which claims priority to Korean Application No. 10-2015-0062126, filed on Apr. 30, 2015, the entire contents of all of which are incorporated herein by reference.

BACKGROUND

1. Field

The present invention relates to a composition for window films, a flexible window film produced therefrom, and a flexible display device comprising the same.

2. Description of Related Art

Recently, with the replacement of a glass substrate or a high hardness substrate with a film in a display device, a flexible display device capable of being folded or unfolded has been developed in the related art. The flexible display device is thin and light, has high impact resistance, can be folded and unfolded, and thus can be manufactured in various shapes.

In such a flexible display device, not only a substrate but also various elements are required to have flexibility. Particularly, since a window film is disposed at the outermost side of the display, it is necessary for the window film to have flexibility and high hardness. Further, since the window film is manufactured by coating and curing a composition for window films on a base layer, the window film can suffer from curling.

The background technique of the present invention is disclosed in JP Unexamined Patent Publication No. 2007-176542.

SUMMARY

It is one aspect of the present invention to provide a composition for window films that can realize a flexible window film having high hardness and good flexibility.

It is another aspect of the present invention to provide a composition for window films that can realize a flexible window film capable of suppressing curling.

It is a further aspect of the present invention to provide a flexible window film that has high hardness and good flexibility and is capable of suppressing curling.

It is yet another aspect of the present invention to provide a flexible display device including the flexible window film as set forth above.

In accordance with one aspect of the present invention, a composition for window films includes: a first silicone resin represented by Formula 1; a second silicone resin containing a crosslinkable functional group and at least one of a Q unit and a bridge unit; a crosslinking agent; and an initiator:

<Formula 1>

(in Formula 1, $R^1$, $R^2$, $R^3$, $R^4$, $R^5$, $R^6$, $R^7$, $R^8$, n, x, y, z, and w are the same as defined in the following detailed description of the invention).

In accordance with another aspect of the present invention, a flexible window film includes: a base layer; and a coating layer formed on one surface of the base layer, wherein the coating layer is formed of the composition for window films as set forth above.

In accordance with a further aspect of the present invention, a flexible display device includes the flexible window film as set forth above.

The present invention provides a composition for window films that can realize a flexible window film having high hardness and good flexibility.

The present invention provides a composition for window films that can realize a flexible window film capable of suppressing curling.

The present invention provides a flexible window film that has high hardness and good flexibility and is capable of suppressing curling.

The present invention provides a flexible display device including the flexible window film as set forth above.

DETAILED DESCRIPTION

Embodiments of the present invention will be described in detail with reference to the accompanying drawings. It should be understood that the present invention is not limited to the following embodiments and may be embodied in different ways. In the drawings, portions irrelevant to the description will be omitted for clarity. Like components will be denoted by like reference numerals throughout the specification.

Herein, spatially relative terms such as "upper" and "lower" are defined with reference to the drawings. Thus, it will be understood that the term "upper surface" can be used interchangeably with the term "lower surface". In addition, when an element such as a layer or a film is referred to as being placed "on" another element, it can be directly placed on the other element or intervening element(s) may be present. On the other hand, when an element is referred to as being placed "directly on" another element, there are no intervening element(s) therebetween.

Herein, "pencil hardness" is measured on a coating layer of a window film using a pencil hardness tester (Heidon) in accordance with JIS K5400. In measurement of pencil hardness, pencils of 6B to 9H (Mitsubishi Co., Ltd.) are used. Specifically, pencil hardness is measured under conditions of a pencil load of 1 kg on the coating layer, a scratch angle of 45, and a scratch speed of 60 mm/min. When the coating layer has one or more scratches after being tested 5 times using a certain pencil, pencil hardness is measured again using another pencil having one-level lower pencil hardness than the previous pencil, and the maximum value of pencil hardness allowing no scratch to be observed all five times on the coating layer is taken as pencil hardness of the coating layer.

Herein, "radius of curvature" means a minimum radius of a jig causing no cracks on a window film specimen when the window film specimen is wound around the jig for measuring a radius of curvature (CFT-200R, Covotech Co., Ltd.), kept wound for 5 seconds, unwound, and then observed with the naked eye to determine whether the specimen has cracks. Here, a radius of curvature in the compressive direction is measured when the specimen is wound around the jig such that a window coating layer of the window film contacts a surface of the jig, and a radius of curvature in the tensile direction is measured when the specimen is wound around the jig such that a base layer of the window film contacts the jig. Here, the window film specimen has a thickness of 50 μm to 300 μm.

Figure 7:
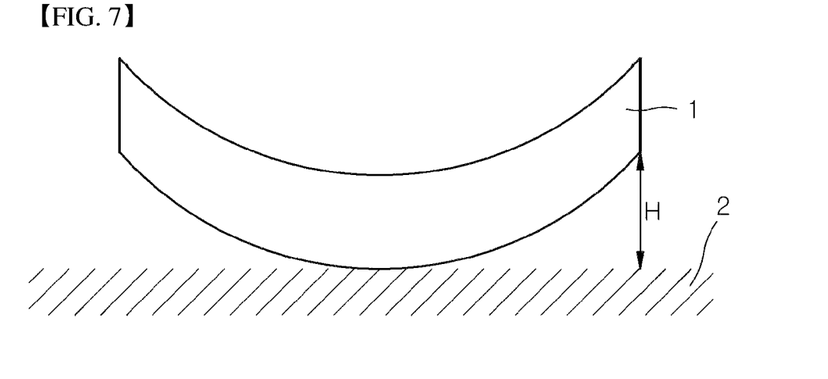
FIG. 7 is a diagram illustrating a method of measuring a curl.

Herein, referring to FIG. 7, "curl" means a maximum height H from a floor 2 to an edge of a window film 1 (width×length×thickness, 3 cm×15 cm×130 μm, base layer thickness: 80 μm, coating layer thickness: 50 μm) placed on the floor 2, as measured after the window film 1 is left under conditions of 25° C. and 40% RH.

Herein, the term "(meth)acryl" refers to "acryl" and/or "methacryl".

Herein, unless otherwise stated, "substituted" means that at least one hydrogen atom in a functional group is substituted with a hydroxyl group, an unsubstituted $C_1$ to $C_{10}$ alkyl group, a $C_1$ to $C_{10}$ alkoxy group, a $C_3$ to $C_{10}$ cycloalkyl group, a $C_6$ to $C_{20}$ aryl group, a $C_7$ to $C_{20}$ arylalkyl group, a $C_6$ to $C_{20}$ aryl group substituted with a $C_1$ to $C_{10}$ alkyl group, or a $C_1$ to $C_{10}$ alkyl group substituted with a $C_1$ to $C_{10}$ alkoxy group.

Herein, the term "crosslinkable functional group" means a functional group allowing crosslinking reaction by heat and/or light. Specifically, the crosslinkable functional group means an epoxy group, an epoxy group-containing group, an oxetanyl group, an oxetanyl group-containing group, and the like. Herein, the "epoxy group-containing group" means a glycidyl group, a glycidoxy group, an epoxylated $C_4$ to $C_{20}$ (for example, $C_5$ to $C_{20}$) cycloalkyl group, a glycidyl group-containing $C_1$ to $C_{20}$ alkyl group, a glycidoxy group-containing $C_1$ to $C_{20}$ alkyl group, an epoxylated $C_4$ to $C_{20}$ (for example, $C_5$ to $C_{20}$) cycloalkyl group-containing $C_1$ to $C_{20}$ alkyl group, a glycidyl group-containing $C_5$ to $C_{20}$ cycloalkyl group, a glycidoxy group-containing $C_5$ to $C_{20}$ cycloalkyl group, or an epoxylated $C_4$ to $C_{20}$ (for example, $C_5$ to $C_{20}$) cycloalkyl group-containing $C_5$ to $C_{20}$ cycloalkyl group. Herein, the "oxetanyl group-containing group" means an oxetanyloxy group, an oxetanyl group-containing $C_1$ to $C_{20}$ alkyl group, an oxetanyloxy group-containing $C_1$ to $C_{20}$ alkyl group, an oxetanyl group-containing $C_5$ to $C_{20}$ cycloalkyl group, or an oxetanyloxy group-containing $C_5$ to $C_{20}$ cycloalkyl group. Herein, "Ec" refers to an epoxycyclohexylethyl group, "Gp" refers to a glycidoxypropyl group, "Op" refers to an oxetanylpropyl group, "Me" refers to a methyl group, and "Et" refers to an ethyl group. Herein, "halogen" means fluorine, chlorine, bromine, or iodine.

Hereinafter, a composition for window films according to one embodiment of the present invention will be described.

The composition for window films according to the embodiment includes: a first silicone resin represented by Formula 1; a second silicone resin containing a crosslinkable functional group and at least one of a Q unit and a bridge unit; a crosslinking agent; and an initiator.

$(R^1SiO_{3/2})_x([R^2R^3SiO_{2/2}]_n)_y(R^4R^5SiO_{2/2})_z$
$(R^6R^7R^8SiO_{1/2})_w$ <Formula 1>

(in Formula 1, $R^1$ is a crosslinkable functional group; $R_2$ and $R_3$ are each independently a methyl group; $R_4$ and $R_5$ are each independently hydrogen, a crosslinkable functional group, an unsubstituted or substituted $C_1$ to $C_{20}$ alkyl group, or an unsubstituted or substituted $C_5$ to $C_{20}$ cycloalkyl group;

$R_6$, $R_7$ and $R_8$ are each independently hydrogen, a crosslinkable functional group, an unsubstituted or substituted $C_1$ to $C_{20}$ alkyl group, an unsubstituted or substituted $C_5$ to $C_{20}$ cycloalkyl group, or an unsubstituted or substituted $C_6$ to $C_{30}$ aryl group;

n is an integer of 7 to 100; and $0<x<1$, $0.01 \leq y \leq 0.6$, $0 \leq z <1$, $0 \leq w <1$, and $x+y+z+w=1$).

The composition for window films according to this embodiment includes both the first silicone resin and the second silicone resin, and can realize a window film that exhibits good flexibility and hardness and is capable of suppressing curling. Herein, "bridge unit" means a unit in which Si and Si are bonded to each other by an aliphatic hydrocarbon group, an alicyclic hydrocarbon group or an aromatic hydrocarbon group instead of being directly bonded to each other. The first silicone resin, the second silicone resin, the crosslinking agent and the initiator are different from one another.

The first silicone resin is a binder that forms a window film, and can be represented by Formula 1. The first silicone resin contains $(R^1SiO_{3/2})$ and $([R^2R^3SiO_{2/2}]_n)$, thereby improving both hardness and flexibility of the window film. The first silicone resin may be a silicone resin including a block of $(R^2R^3SiO_{2/2})$, in which $R^2R^3SiO_{2/2}$ is successively repeated n times. As a result, the first silicone resin can provide a significant effect in improvement of hardness and flexibility of the window film. $([R^2R^3SiO_{2/2}]_n)$ may be included at a certain location in the first silicone resin. For example, $([R^2R^3SiO_{2/2}]_n)$ may be included between two selected from among $(R^1SiO_{3/2})$, $(R^4R^5SiO_{2/2})$, and $(R^6R^7R^8SiO_{1/2})$. For example, $([R^2R^3SiO_{2/2}]_n)$ may be branched to a side chain of $(R^1SiO_{3/2})$. For the first silicone resin, coupling structures between $(R^1SiO_{3/2})$, $(R^4R^5SiO_{2/2})$ and $(R^6R^7R^8SiO_{1/2})$ are not particularly limited. For example, at least one of $(R^1SiO_{3/2})$, $(R^4R^5SiO_{2/2})$ and $(R^6R^7R^8SiO_{1/2})$ may be included in the form of a random, alternating, or block copolymer in the first silicone resin. The first silicone resin contains about 1 mol % to about 60 mol % of $([R^2R^3SiO_{2/2}]_n)$, thereby improving both hardness and flexibility of the window film. Specifically, the first silicone resin includes about 1 mol % to about 50 mol % of $([R^2R^3SiO_{2/2}]_n)$, more specifically about 5 mol % to about 40 mol %, for example, about 5 mol % to about 35 mol %. In the first silicone resin, $R^4$ and $R^5$ can provide crosslinkability and flexibility, thereby further improving hardness and flexibility of the window film. In the first silicone resin, $R^6$, $R^7$ and $R^8$ can further enhance a crosslinking density of the window film. In the composition for window films, the first silicone resin may be used alone or as a mixture thereof. The first silicone resin may have a weight average molecular weight of about 3,000 to about 200,000, specifically about 3,500 to about 10,000, about 3,500 to about 9,000, about 3,500 to about 8,000, about 3,500 to about 7,000, or about 3,500 to about 6,000. Within this range, the composition can support a coating layer of the window film. The first silicone resin may have a polydispersity index (PDI) of about 1.0 to about 3.0, specifically about 1.5 to about 2.5, and an epoxy equivalent weight of about 0.1 mol/100 g to about 1.0 mol/100 g, specifically about 0.2 mol/100 g to about 0.8 mol/100 g. Within this range, the composition can provide good coatability and stable coating properties. In the composition for window films, the first silicone resin may be present in an amount of about 30 wt % to about 99 wt %, specifically about 60 wt % to about 90 wt %, more specifically about 70 wt % to about 85 wt %, in terms of solid content. Within this range, the composition can prevent increase in haze of a window film.

In one embodiment, the first silicone resin may be a silicone resin represented by Formula 1-1:

$$(R^1SiO_{3/2})_x([R^2R^3SiO_{2/2}]_n)_y \qquad \text{<Formula 1-1>}$$

(in Formula 1-1, $R^1$, $R^2$, $R^3$ and n are the same as defined in Formula 1, $0.45 \le x \le 0.99$, $0.01 \le y \le 0.6$, and $x+y=1$).

Specifically, in Formula 1-1, x and y may be defined by about $0.5 \le x \le 0.99$ and about $0.01 \le y \le 0.5$, more specifically about $0.65 \le x \le 0.95$ and about $0.05 \le y \le 0.4$. Within this range, the composition can secure good flexibility of the window film. Specifically, $R^1$ may be a glycidoxy group-containing $C_1$ to $C_{20}$ alkyl group, an epoxylated $C_4$ to $C_{20}$ cycloalkyl group-containing $C_1$ to $C_{20}$ alkyl group, or an oxetanyl group-containing $C_1$ to $C_{20}$ alkyl group.

Specifically, the first silicone resin may be represented by one of the following formulae 1-1A to 1-1C:

$$(EcSiO_{3/2})_x([(Me)_2SiO_{2/2}]_n)_y \qquad \text{<Formula 1-1A>}$$

$$(GpSiO_{3/2})_x([(Me)_2SiO_{2/2}]_n)_y \qquad \text{<Formula 1-1B>}$$

$$(OpSiO_{3/2})_x([(Me)_2SiO_{2/2}]_n)_y \qquad \text{<Formula 1-1C>}$$

(in Formulae 1-1A to 1-1C, n is the same as defined in Formula 1, and x and y are the same as defined in Formula 1-1).

The first silicone resin may be prepared by hydrolysis and condensation of a mixture including a first silicon monomer and a resin for polydimethylsiloxane. The first silicon monomer may be present in an amount of about 40 mol % to about 99 mol %, specifically about 50 mol % to about 99 mol %, more specifically about 60 mol % to about 95 mol %, or about 65 mol % to about 95 mol %, in the mixture. Within this range, the composition can improve hardness of the window film while securing flexibility thereof. In the mixture, the resin for polydimethylsiloxane may be present in an amount of about 1 mol % to about 60 mol %, specifically about 1 mol % to about 50 mol %, more specifically about 5 mol % to about 40 mol %, or about 5 mol % to about 35 mol %. Within this range, the composition can improve both hardness and flexibility of the window film.

The first silicon monomer may be a silane compound having $R^1$ of Formula 1. Specifically, the first silicon monomer may be represented by the following Formula 2. These may be used alone or as a mixture.

$$SiR^1R^9R^{10}R^{11} \qquad \text{<Formula 2>}$$

(in Formula 2, $R^1$ is the same as defined in Formula 1, and $R^9$, $R^{10}$ and $R^{11}$ are each independently a halogen atom, a hydroxyl group or a $C_1$ to $C_{10}$ alkoxy group). More specifically, the first silicon monomer is a trialkoxysilane compound and may include, for example, 2-(3,4-epoxycyclohexyl)ethyltriethoxysilane, 2-(3,4-epoxycyclohexyl)ethyltrimethoxysilane, and 3-glycidoxypropyltriethoxysilane, without being limited thereto.

The resin for polydimethylsiloxane may include a resin having chlorine, a hydroxyl group or a $C_1$ to $C_{10}$ alkoxy group in $[(R^2R^3SiO_{2/2})]_n$ of Formula 1 and at both ends thereof. Hydrolysis and condensation may be carried out by a typical method of preparing a silicone resin. Hydrolysis may include allowing the first silicon monomer and the resin for polydimethylsiloxane to be reacted in a mixture of water and at least one of an acid and a base. Specifically, the acid is a strong acid such as HCl, $HNO_3$, acetic acid, and the like, and the base is a strong base such as NaOH, KOH, $NH_4OH$, and the like. Hydrolysis may be performed at about 20° C. to about 100° C. for about 10 minutes to about 7 hours. Condensation may be performed at about 20° C. to about 100° C. for about 10 minutes to about 12 hours under the same conditions as those for hydrolysis. Under these conditions, efficiency in hydrolysis and condensation of the first silicon monomer and the resin for polydimethylsiloxane can be improved.

In another embodiment, the first silicone resin may be a silicone resin including a repeat unit represented by the following Formula 1-2.

$$(R^1SiO_{3/2})_x([R^2R^3SiO_{2/2}]_n)_y(R^4R^5SiO_{2/2})_z \qquad \text{<Formula 1-2>}$$

(in Formula 1-2, $R^1$, $R^2$, $R^3$, $R^4$, $R^5$ and n are the same as defined in Formula 1, $0<x<1$, $0.01 \le y \le 0.6$, $0<z<1$, and $x+y+z=1$).

Specifically, in Formula 1-2, x, y and z may be defined by about $0.1 \le x \le 0.98$, about $0.01 \le y \le 0.6$, and about $0.001 \le z \le 0.3$, more specifically about $0.5 \le x \le 0.94$, about $0.05 \le y \le 0.4$, and about $0.01 \le z \le 0.1$. Within this range, the composition can improve flexibility of the window film. Specifically, $R^1$ is the same as defined in Formula 1-1. Specifically, $R^4$ and $R^5$ may be each independently an unsubstituted or substituted $C_1$ to $C_{20}$ alkyl group. Under these conditions, the first silicone resin can improve flexibility of the window film. Further, $R^4$ may be an unsubstituted or substituted $C_1$ to $C_{20}$ alkyl group and $R^5$ may be a crosslinkable functional group. Under these conditions, the first silicone resin can improve hardness of the window film by further improving the degree of crosslinking of the composition for window films. More specifically, $R^4$ and $R^5$ are each independently a (3,4-epoxycyclohexyl)methyl group, a (3,4-epoxycyclohexyl)ethyl group, a (3,4-epoxycyclohexyl)propyl group, a glycidoxypropyl group, a methyl group, or an ethyl group.

More specifically, the first silicone resin may be represented by one of the following Formulae 1-2A to 1-2H:

$$(GpSiO_{3/2})_x([(Me)_2SiO_{2/2}]_n)_y(EcMeSiO_{2/2})_z \qquad \text{<Formula 1-2A>}$$

$$(GpSiO_{3/2})_x([(Me)_2SiO_{2/2}]_n)_y((Me)_2SiO_{2/2})_z \qquad \text{<Formula 1-2B>}$$

$$(GpSiO_{3/2})_x([(Me)_2SiO_{2/2}]_n)_y(MeEtSiO_{2/2})_z \qquad \text{<Formula 1-2C>}$$

$$(GpSiO_{3/2})_x([(Me)_2SiO_{2/2}]_n)_y(GpMeSiO_{2/2})_z \qquad \text{<Formula 1-2D>}$$

$$(EcSiO_{3/2})_x([(Me)_2SiO_{2/2}]_n)_y(EcMeSiO_{2/2})_z \qquad \text{<Formula 1-2E>}$$

$$(EcSiO_{3/2})_x([(Me)_2SiO_{2/2}]_n)_y((Me)_2SiO_{2/2})_z \qquad \text{<Formula 1-2F>}$$

$$(EcSiO_{3/2})_x([(Me)_2SiO_{2/2}]_n)_y(MeEtSiO_{2/2})_z \qquad \text{<Formula 1-2G>}$$

$$(EcSiO_{3/2})_x([(Me)_2SiO_{2/2}]_n)_y(GpMeSiO_{2/2})_z \qquad \text{<Formula 1-2H>}$$

(in Formulae 1-2A to 1-2H, n is an integer of 7 to 100, $0<x<1$, $0.01 \le y \le 0.6$, $0<z<1$, and $x+y+z=1$).

The first silicone resin may be prepared through hydrolysis and condensation of a mixture including the first silicon monomer, the resin for polydimethylsiloxane and a second silicon monomer. In the mixture, the first silicon monomer may be present in an amount of about 10 mol % to about 98 mol %, specifically about 50 mol % to about 94 mol %. Within this range, the composition can secure good flexibility of the window film while improving hardness thereof. In the monomer mixture, the resin for polydimethylsiloxane may be present in an amount of about 1 mol % to about 60 mol %, specifically about 5 mol % to about 40 mol %. In the monomer mixture, the second silicon monomer may be present in an amount of about 0.1 mol % to about 30 mol %, specifically about 1 mol % to about 10 mol %. Within this range, the composition can secure hardness of the window film while improving flexibility thereof.

The first silicon monomer may be represented by Formula 2. The resin for polydimethylsiloxane may include the resin described above. The second silicon monomer may be represented by the following Formula 3. These may be used alone or as a mixture thereof.

$$SiR^4R^5R^{12}R^{13} \qquad \text{<Formula 3>}$$

(in Formula 3, $R^4$ and $R^5$ are the same as defined in Formula 1, and $R^{12}$ and $R^{13}$ are each independently a halogen atom, a hydroxyl group or a $C_1$ to $C_{10}$ alkoxy group). More specifically, the second silicon monomer is a dialkoxysilane compound and may include, for example, 2-(3,4-epoxycyclohexyl)ethylmethyldiethoxysilane, dimethyldimethoxysilane, and (3-glycidoxypropyl)methyldiethoxysilane, without being limited thereto.

In another embodiment, the first silicone resin may be a silicone resin represented by Formula 1-3.

$$(R^1SiO_{3/2})_x([R^2R^3SiO_{2/2}]_n)_y(R^6R^7R^8SiO_{1/2})_w \qquad \text{<Formula 1-3>}$$

(in Formula 1-3, $R^1$, $R^2$, $R^3$, $R^6$, $R^7$, $R^8$ and n are the same as defined in Formula 1, 0<x<1, 0.01≤y≤0.6, 0<w<1, and x+y+w=1).

Specifically, in Formula 1-3, x, y and w may be defined by about 0.35≤x≤0.9899, about 0.01≤y≤0.6, and about 0.0001≤w>0.1, more specifically about 0.55≤x≤0.949, about 0.05≤y≤0.4, and about 0.001≤w≤0.05. Within this range, the composition can improve flexibility and crosslinking density of the window film. At least one of $R^6$, $R^7$ and $R^8$ may be a crosslinkable functional group.

The first silicone resin may be prepared through hydrolysis and condensation of a mixture including the first silicon monomer, the resin for polydimethylsiloxane, and a third silicon monomer. In the mixture, the first silicon monomer may be present in an amount of about 30 mol % to about 98.99 mol %, specifically about 55 mol % to about 94.9 mol %. Within this range, the composition can secure good flexibility of the window film. In the monomer mixture, the resin for polydimethylsiloxane may be present in an amount of about 1 mol % to about 60 mol %, specifically about 5 mol % to about 40 mol %. In the monomer mixture, the third silicon monomer may be present in an amount of about 0.01 mol % to about 10 mol %, specifically about 0.1 mol % to about 5 mol %. Within this range, the composition can secure good flexibility of the window film.

The first silicon monomer may be represented by Formula 2. The resin for polydimethylsiloxane may include the resin described above. The third silicon monomer may be represented by the following Formula 4. These may be used alone or as a mixture thereof.

$$R^6R^7R^8Si-O-SiR^6R^7R^8 \qquad \text{<Formula 4>}$$

(in Formula 4, $R^6$, $R^7$ and $R^8$ are the same as defined in Formula 1).

Specifically, the third silicon monomer may include 1,3-bis(glycidoxypropyl)tetramethyldisiloxane, and 1,3-bis[2-(3,4-epoxycyclohexyl)ethyl]tetramethyldisiloxane, without being limited thereto.

The second silicone resin may include a silicone resin containing a crosslinkable functional group and at least one of a Q unit and a bridge unit. With such a rigid structure, the second silicone resin can be cured together with the first silicone resin, thereby improving hardness of the window film.

The second silicone resin may be used alone or as a mixture in the composition for window films. The second silicone resin may have a weight average molecular weight of about 1,000 to about 20,000, specifically about 1,500 to about 15,000, more specifically about 2,000 to about 6,000, still more specifically about 3,000 to about 6,000, about 3,000 to about 5,000, or about 3,000 to about 4,000. Within this range, the composition can improve hardness of the window film. The second silicone resin may have a polydispersity index (PDI) of about 1.0 to about 3.5, specifically about 1.5 to about 3.0, and an epoxy equivalent weight of about 0.1 mol/100 g to about 2.0 mol/100 g, specifically about 0.4 mol/100 g to about 1.5 mol/100 g. Within this range, the composition can improve hardness of the window film. In the composition for window films, the second silicone resin may be present in an amount of about 0.1 wt % to about 50 wt %, specifically about 1 wt % to about 30 wt %, more specifically about 1 wt % to about 15 wt %, in terms of solid content. Within this range, the composition can secure good hardness and flexibility of the window film.

In one embodiment, the second silicone resin may contain a Q unit represented by $SiO_{4/2}$ and a crosslinkable functional group. Specifically, the second silicone resin may be represented by Formula 5:

<Formula 5>

(in Formula 5, * is a linking site of an element, $R^{14}$, $R^{15}$, $R^{16}$, $R^{17}$, $R^{18}$ and $R^{19}$ are each independently a crosslinkable functional group, or a substituted or unsubstituted $C_1$ to $C_{10}$ alkyl group, and n is an integer of 10 to 200).

Specifically, at least one of $R^{14}$, $R^{15}$ and $R^{16}$ is a crosslinkable functional group and at least one of $R^{17}$, $R^{18}$ and $R^{19}$ is a crosslinkable functional group. $R^{14}$, $R^{15}R^{16}$, $R^{17}$, $R^{18}$ and $R^{19}$ are an epoxy group, an epoxy group-containing functional group, or an unsubstituted $C_1$ to $C_{10}$ alkyl group, more specifically a glycidoxypropyl group, an epoxycyclohexylethyl group, or a methyl group. Specifically, the second silicone resin may be represented by the following Formula 5-1 or 5-2, without being limited thereto:

<Formula 5-1>

<Formula 5-2>

(in Formula 5-1 and Formula 5-2, n is an integer of 10 to 200).

The second silicone resin may be prepared by a typical method. For example, the second silicone resin may be prepared through reaction of a vinyl compound having a crosslinkable functional group with a mixture of tetraalkoxysilane and tetraalkyldisiloxane. Alternatively, the second silicone resin may be prepared through reaction of Hydride Q resin (HQM-107, Gelest Inc.) with the vinyl compound having a crosslinkable functional group. Specifically, tetraalkoxysilane may include at least one of tetramethoxysilane, tetraethoxysilane, tetrapropoxysilane, and tetrabuthoxysilane. Tetraalkyldisiloxane may include at least one of 1,1,3,3-tetramethyldisiloxane and tetrapropyldisiloxane. The vinyl compound having a crosslinkable functional group may include at least one of 4-vinylcyclohexene epoxide and allyl glycidyl ether. In order to improve production yield of the second silicone resin, a platinum catalyst may be further used. The platinum catalyst may include a vinylalkylsilane platinum complex including Karstedt's catalyst, platinum black, chloroplatinic acid, a chloroplatinic acid-olefin complex, a chloroplatinic acid-alcohol complex, or mixtures thereof.

In another embodiment, the second silicone resin may contain a bridge unit and a crosslinkable functional group. Specifically, the second silicone resin may be represented by the following Formula 6:

<Formula 6>

(in Formula 6, * is a linking site of an element;
$R^{20}$ is a substituted or unsubstituted $C_1$ to $C_{20}$ alkylene group, a substituted or unsubstituted $C_2$ to $C_{20}$ alkenylene group, a substituted or unsubstituted $C_2$ to $C_{20}$ alkynylene group, a substituted or unsubstituted $C_6$ to $C_{20}$ arylene group, a substituted or unsubstituted $C_7$ to $C_{30}$ arylalkylene group, or a substituted or unsubstituted $C_3$ to $C_{20}$ cycloalkylene group;
$R^{14}$, $R^{15}$, $R^{16}$, $R^{17}$, $R^{18}$ and $R^{19}$ are the same as defined in Formula 5; and
n is an integer of 15 to 120).

Specifically, in Formula 6, $R^{20}$ may be an ethylene group, a propylene group, a butylene group, a pentylene group, a hexylene group, a heptylene group, an octylene group, a nonylene group, a decylene group, a phenylene group, a naphthylene group, or (* is a linking site, and m and n are each independently an integer of 1 to 10), or the like.

Specifically, n may be an integer of 20 to 80.

Specifically, the second silicone resin may be represented by the following Formula 6-1 or 6-2, without being limited thereto.

<Formula 6-1>

<Formula 6-2>

(in Formula 6-1 and Formula 6-2, * is a linking site of an element and n is an integer of 15 to 120).

The second silicone resin may be prepared by a typical method. For example, the second silicone resin may be prepared through reaction of 1,2-bis(triethoxysilyl)ethane and 1,1,3,3-tetramethyldisiloxane with a vinyl compound having a crosslinkable functional group, for example, 4-vinyl-1-cyclohexene epoxide or allyl glycidyl ether, without being limited thereto. In order to improve production yield of the second silicone resin, a platinum catalyst may be further used.

The crosslinking agent containing a crosslinkable functional group can be cured together with the first silicone resin and the second silicone resin, thereby improving hardness of the window film. The crosslinking agent may further include at least one of a non-cyclic aliphatic hydrocarbon group, a cyclic aliphatic hydrocarbon group, and a hydrogenated aromatic hydrocarbon group in order to further improve flexibility of a coating layer.

Specifically, the crosslinking agent may include at least one of a non-cyclic aliphatic epoxy monomer, a cyclic aliphatic epoxy monomer, a hydrogenated aromatic hydrocarbon epoxy monomer, and an oxetane monomer, and these may be used alone or as a mixture thereof.

The non-cyclic aliphatic epoxy monomer may include 1,4-butanedioldiglycidyl ether, 1,6-hexanediol diglycidyl ether, neopentylglycol diglycidyl ether, trimethylolpropane triglycidyl ether, polyethylene glycol diglycidyl ether, glycerin triglycidyl ether, and polypropylene glycol diglycidyl ether; polyglycidyl ethers of polyetherpolyol obtained by adding one or more types of alkylene oxide to aliphatic polyhydric alcohols, such as ethylene glycol, propylene glycol, glycerin, and the like; diglycidyl esters of aliphatic long-chain dibasic acids; monoglycidyl ethers of higher aliphatic alcohols; glycidyl ethers of higher fatty acids; epoxylated soybean oil; epoxy stearic acid butyl; epoxy stearic acid octyl; epoxylated linseed oil; epoxylated polybutadiene, and the like.

The cyclic aliphatic epoxy monomer is a compound having at least one epoxy group in an alicyclic group. Specifically, the cyclic aliphatic epoxy monomer may include alicyclic epoxy carboxylate, alicyclic epoxy (meth)acrylate or the like. More specifically, the cyclic aliphatic epoxy monomer may include (3,4-epoxycyclohexyl)methyl 3',4'-epoxycyclohexanecarboxylate, diglycidyl 1,2-cyclohexanedicarboxylate, 2-(3,4-epoxycyclohexyl-5,5-spiro-3,4-epoxy)cyclohexane-meta-dioxane, bis(3,4-epoxycyclohexylmethyl)adipate, bis(3,4-epoxy-6-methylcyclohexylmethyl)adipate, 3,4-epoxy-6-methylcyclohexylmethyl-3',4'-epoxy-6'-methylcyclohexanecarboxylate, ε-caprolactone-modified 3,4-epoxycyclohexylmethyl-3',4'-epoxy-cyclohexanecarboxylate, trimethylcaprolactone-modified 3,4-epoxycyclohexylmethyl-3',4'-epoxy-cyclohexanecarboxylate, β-methyl-δ-valerolactone modified 3,4-epoxycyclohexylmethyl-3',4'-epoxycyclohexanecarboxylate, 1,4-cyclohexanedimethanol bis(3,4-epoxycyclohexanecarboxylate, ethylene glycol di(3,4-epoxycyclohexylmethyl)ether, ethylene bis(3,4-epoxycyclohexanecarboxylate), 3,4-epoxycyclohexylmethyl (meth)acrylate, 4-vinylcyclohexene dioxide, vinylcyclohexene monoxide, 1,4-cyclohexanedimethanol diglycidyl ether, and the like. Particularly, an epoxy monomer having a bulky structure, for example, cyclohexyl dicarboxylate, can suppress curling of a flexible window film. Specifically, diglycidyl 1,2-cyclohexanedicarboxylate, 1,4-cyclohexanedimethanol diglycidyl ether, 2,2'-((1-methylethylidene)bis(cyclohexane-4,1-diyloxymethylene))bisoxirane may be used.

The hydrogenated aromatic hydrocarbon epoxy monomer means a monomer compound obtained by selective hydrogenation of an aromatic epoxy monomer in the presence of a catalyst under pressure. Examples of the aromatic epoxy monomer may include: bisphenol type epoxy resins such as diglycidyl ether of bisphenol A, diglycidyl ether of bisphenol F, and diglycidyl ether of bisphenol S; novolac type epoxy resins such as a phenol novolac epoxy resin, a cresol novolac epoxy resin, and a hydroxybenzaldehyde phenol novolac epoxy resin; and polyfunctional epoxy resins such as glycidyl ether of tetrahydroxyphenyl methane, glycidyl ether of tetrahydroxybenzophenone, and epoxylated polyvinyl phenol.

The oxetane monomer may include at least one selected from among 3-methyloxetane, 2-methyloxetane, 2-ethylhexyloxetane, 3-oxetanol, 2-methyleneoxetane, 3,3-oxetanedimethanethiol, 4-(3-methyloxetan-3-yl)benzonitrile, N-(2,2-dimethylpropyl)-3-methyl-3-oxetanmethaneamine, N-(1,2-dimethylbutyl)-3-methyl-3-oxetanmethaneamine, (3-ethyloxetan-3-yl)methyl(meth)acrylate, 4-[(3-ethyloxetan-3-yl)methoxy]butan-1-ol, 3-ethyl-3-hydroxymethyloxetane, xylene bis-oxetane, and 3-[ethyl-3[[(3-ethyloxetan-3-yl]methoxy]oxetane, without being limited thereto.

In the composition for window films, the crosslinking agent may be present in an amount of about 0.1 wt % to about 50 wt %, specifically about 5 wt % to about 30 wt %, more specifically about 5 wt % to about 20 wt %, or about 5 wt % to about 15 wt %, in terms of solid content. Within this range, the composition can improve flexibility and hardness of a coating layer.

The initiator cures the first silicone resin, the second silicone resin and the crosslinking agent. The initiator may include at least one of a photocationic initiator and a photo-radical initiator. The initiator may be used alone or as a mixture thereof.

As the photocationic initiator, any typical photocationic initiator known to those skilled in the art may be used. Specifically, the photocationic polymerization initiator may include an onium salt containing a cation and an anion. Specifically, examples of the cation may include: diaryliodonium such as diphenyliodonium, 4-methoxydiphenyliodonium, (4-methylphenyl)[4-(2-methylpropyl)phenyl])iodonium, bis(4-methylphenyl)iodonium, bis(4-tert-butylphenyl)iodonium, and bis(dodecylphenyl)iodonium; triarylsulfonium such as triphenylsulfonium, diphenyl-4-thiophenylphenylsulfonium, and diphenyl-4-thiophenoxyphenylsulfonium; bis[4-(diphenylsulfonio)phenyl]sulfide, and the like. Specifically, examples of the anion may include hexafluorophosphate ($PF_6^-$), tetrafluoroborate ($BF_4^-$), hexafluoroantimonate ($SbF_6^-$), hexafluoroarsenate ($AsF_6^-$), hexachloroantimonate ($SbCl_6^-$), and the like.

In the composition for window films, the initiator may be present in an amount of about 0.1 wt % to about 20 wt %, specifically about 1 wt % to about 10 wt %, about 1 wt % to about 5 wt %, in terms of solid content. Within this range, the silicone resin can be sufficiently cured without deterioration in transparency of the window film due to remaining initiator.

The composition for window films according to this embodiment may further include nanoparticles.

The nanoparticles can further improve hardness of the window film. The nanoparticles may include at least one of silica, aluminum oxide, zirconium oxide, and titanium oxide, without being limited thereto. The nanoparticles may be partially or entirely subjected to surface treatment with a silicone compound for mixing with the silicone resin. The nanoparticles are not limited to a particular shape or size. Specifically, the nanoparticles may include spherical, flake, or amorphous particles. The nanoparticles may have an average particle size of about 1 nm to about 200 nm, specifically about 10 nm to about 50 nm. Within this range, the nanoparticles can increase hardness of the window film without affecting surface roughness and transparency of the window film. The nanoparticles may be present in an amount of about 0.1 parts by weight to about 60 parts by weight, specifically about 10 parts by weight to about 50 parts by weight, relative to 100 parts by weight of the first silicone resin. Within this range, the nanoparticles can increase hardness of the window film without affecting surface roughness and transparency thereof.

The composition for window films according to this embodiment may further include additives. The additives can provide additional functions to the window film. The additives may be any additives commonly used for window films in the related art. Specifically, the additives may include at least one of a UV absorbent, a reaction inhibitor, an adhesion promoter, a thixotropic agent, a conductivity imparting agent, a color adjusting agent, a stabilizer, an antistatic agent, an antioxidant, and a leveling agent, without being limited thereto. The reaction inhibitor may include ethynylcyclohexane. The adhesion promoter may include an epoxy or alkoxysilyl group-containing silane compound. The thixotropic agent may include fumed silica. The conductivity imparting agent may include metal powder such as silver powder, copper powder, aluminum powder, and the like. The color adjusting agent may include pigments, dyes, and the like. The UV absorbent can improve light resistance of the window film. The UV absorbent may be any typical absorbent known to those skilled in the art. Specifically, the UV absorbent may include at least one of triazine, benzimidazole, benzophenone, and benzotriazole UV absorbents, without being limited thereto. The additives may be present in an amount of about 0.01 parts by weight to about 5 parts by weight, specifically about 0.1 parts by weight to about 2.5 parts by weight, relative to 100 parts by weight of the first silicone resin. Within this range, the additives can improve hardness and flexibility of the window film while realizing effects thereof.

The composition for window films according to this embodiment may further include a solvent to improve coatability, wettability or processability. The solvent may include methylethylketone, methylisobutylketone, and propylene glycol monomethyletheracetate, without being limited thereto.

Figure 1:
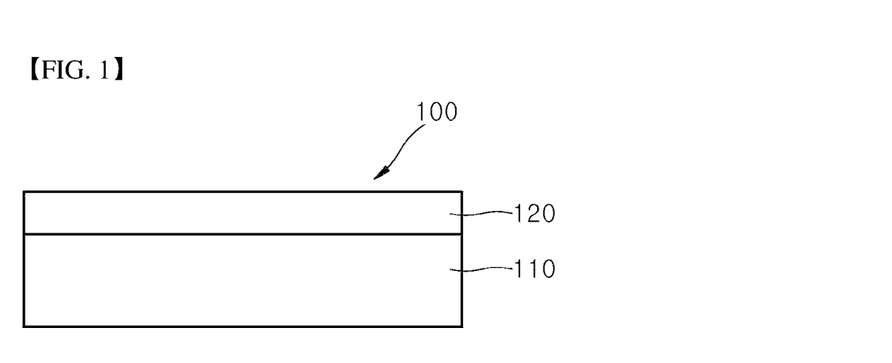
FIG. 1 is a sectional view of a flexible window film according to one embodiment of the present invention.

Next, a flexible window film according to one embodiment will be described with reference to FIG. 1. FIG. 1 is a sectional view of a flexible window film according to one embodiment of the invention.

Referring to FIG. 1, a flexible window film 100 according to one embodiment of the invention may include a base layer 110 and a coating layer 120, in which the coating layer 120 may be formed of the composition for window films according to the embodiment of the present invention.

The base layer 110 can improve mechanical strength of the flexible window film 100 by supporting the coating layer 120 of the flexible window film 100. The base layer 110 may be attached to a display part, a touchscreen panel or a polarizing plate via an adhesive layer or the like. The base layer 110 may be formed of an optically transparent flexible resin. For example, the resin may include polyester resins including polyethylene terephthalate, polyethylene naphthalate, polybutylene terephthalate, polybutylene naphthalate, and the like, polycarbonate resins, polyimide resins, polystyrene resins, poly(meth)acrylate resins including poly(methyl methacrylate), and the like. In the base layer 110, these resins may be used alone or as a mixture thereof. The base layer 110 may have a thickness of 10 μm to 200 μm, specifically 20 μm to 150 μm, more specifically 50 μm to 100 μm. Within this thickness range, the base layer can be used in the flexible window film.

The coating layer 120 may be formed on the base layer 110 to protect the base layer 110, the display part, the touchscreen panel or the polarizing plate, and has high flexibility and high hardness to be used for a flexible display device. The coating layer 120 may have a thickness of 5 μm to 100 μm, specifically 10 μm to 80 μm. Within this thickness range, the coating layer can be used in the flexible window film. Although not shown in FIG. 1, functional surface layers such as an anti-reflection layer, an anti-glare layer, and a hard coating layer may be further formed on the other surface of the coating layer 120 to provide additional functions. In addition, although not shown in FIG. 1, the coating layer 120 may be further formed on the other surface of the base layer 110.

The flexible window film 100 is optically transparent and may be used in a transparent display. Specifically, the flexible window film 100 may have a transmittance of 88% or more, specifically 88% to 100%, in the visible range, specifically in a wavelength range of 400 nm to 800 nm. Within this range, the flexible window film can be used as a flexible window film. The flexible window film 100 may have a pencil hardness of about 7H or higher, for example, about 7H to about 9H, a radius of curvature of about 5.0 mm or less, for example, about 0.1 mm to about 5.0 mm, and a curl of 15 mm or less, for example, about 0.5 mm to about 15 mm. Within these ranges, the flexible window film has good hardness and flexibility to be used as a flexible window film. The flexible window film 100 may have a thickness of 50 μm to 300 μm. Within this thickness range, the flexible window film can be used as a flexible window film.

The flexible window film 100 may be formed by coating and curing the composition for window films according to the embodiment of the invention on the base layer 110.

A method of coating the composition for window films onto the base layer 110 is not particularly limited. For example, the composition for window films may be coated onto the base layer by bar coating, spin coating, dip coating, roll coating, flow coating, or die coating. The composition for window films may be coated to a thickness of 5 μm to 100 μm on the base layer 110. Within this thickness range, a desired coating layer can be secured while providing good hardness and flexibility. Curing is performed to form the coating layer by curing the composition for window films, and may include at least one of photocuring and heat curing. Photocuring may include irradiating the coated composition at a dose of 10 mJ/cm$^2$ to 1,000 mJ/cm$^2$ at a wavelength of 400 nm or less. Heat curing may be performed at a temperature of 40° C. to 200° C. for 1 hour to 30 hours. Under these conditions, the composition for window films can be sufficiently cured. For example, heat curing may be performed after photocuring in order to achieve higher hardness of the coating layer. Before curing the composition for window films coated onto the base layer 110, the method may further include drying the composition. When curing is performed after drying, it is possible to prevent increase in surface roughness of the coating layer due to photocuring or heat curing for a long period of time. Drying may be performed at 40° C. to 200° C. for 1 minute to 30 hours, without being limited thereto.

Figure 2:
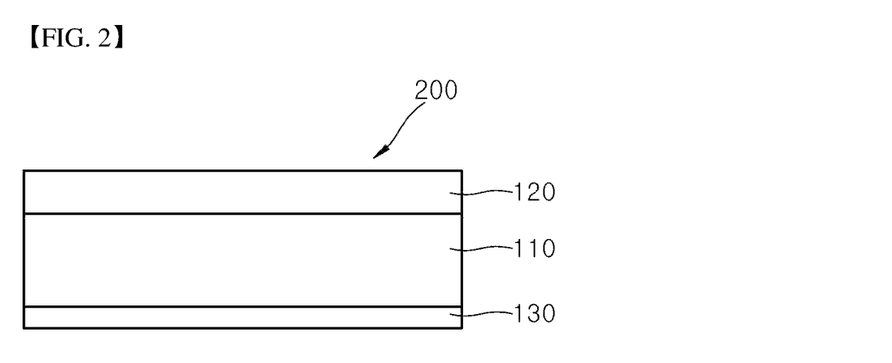
FIG. 2 is a sectional view of a flexible window film according to another embodiment of the present invention.

Next, a flexible window film according to another embodiment will be described with reference to FIG. 2. FIG. 2 is a sectional view of a flexible window film according to another embodiment of the invention.

Referring to FIG. 2, a flexible window film 200 according to another embodiment of the invention may include a base layer 110, a coating layer 120 formed on one surface of the base layer 110, and an adhesive layer 130 formed on the other surface of the base layer 110, in which the coating layer 120 may be formed of the composition for window films according to the embodiment of the present invention.

The adhesive layer 130 formed on the other surface of the base layer 110 can facilitate adhesion between the flexible window film and a touchscreen panel, a polarizing plate or a display part. The flexible window film according to this embodiment is substantially the same as the flexible window film according to the above embodiment excluding the adhesive layer. Thus, the following description will focus on the adhesive layer 130.

The adhesive layer 130 attaches a polarizing plate, a touchscreen panel, or a display part to the flexible window film 200 to be disposed under the flexible window film 200, and may be formed of an adhesive composition for the adhesive layer. Specifically, the adhesive layer 130 may be formed of an adhesive composition comprising an adhesive resin such as a (meth)acrylic resin, a urethane resin, a silicone resin, and an epoxy resin, a curing agent, a photoinitiator, and a silane coupling agent. The (meth)acrylic resin is a (meth)acrylic copolymer having an alkyl group, a hydroxyl group, an aromatic group, a carboxylic acid group, an alicyclic group, a hetero-alicyclic group, and the like, and may include a typical (meth)acrylic copolymer. Specifically, the (meth)acrylic resin may be formed of a monomer mixture including at least one of a (meth)acrylic monomer containing a $C_1$ to $C_{10}$ unsubstituted alkyl group, a (meth)acrylic monomer containing a $C_1$ to $C_{10}$ alkyl group having at least one hydroxyl group, a (meth)acrylic monomer containing a $C_6$ to $C_{20}$ aromatic group, a (meth)acrylic monomer containing a carboxylic acid group, a (meth)acrylic monomer containing a $C_3$ to $C_{20}$ alicyclic group, and a (meth)acrylic monomer containing a $C_3$ to $C_{10}$ hetero-alicyclic group having at least one of nitrogen (N), oxygen (O), and sulfur (S). The curing agent is a polyfunctional (meth)acrylate and may include a bifunctional (meth)acrylate such as hexanediol diacrylate; a trifunctional (meth)acrylate such as trimethylolpropane tri(meth)acrylate; a tetra-functional (meth)acrylate such as pentaerythritol tetra(meth)acrylate; a penta-functional (meth)acrylate such as dipentaerythritol penta(meth)acrylate; and a hexa-functional (meth)acrylate such as dipentaerythritol hexa(meth)acrylate, without being limited thereto. The photoinitiator is a typical photoinitiator and may include the photo-radical initiator described above. The silane coupling agent may include an epoxy group-containing silane coupling agent such as 3-glycidoxypropyltrimethoxysilane. The adhesive composition may include 100 parts by weight of the (meth)acrylic resin, about 0.1 parts by weight to about 30 parts by weight of the curing agent, about 0.1 parts by weight to about 10 parts by weight of the photoinitiator, and about 0.1 parts by weight to about 20 parts by weight of the silane coupling agent. With this composition, the adhesive layer formed of the adhesive composition can sufficiently attach the flexible window film to the display part, the touchscreen panel, or the polarizing plate. The adhesive layer 130 may have a thickness of about 10 μm to about 100 μm. Within this thickness range, the adhesive layer can sufficiently attach the flexible window film to an optical device such as a polarizing plate.

Figure 3:
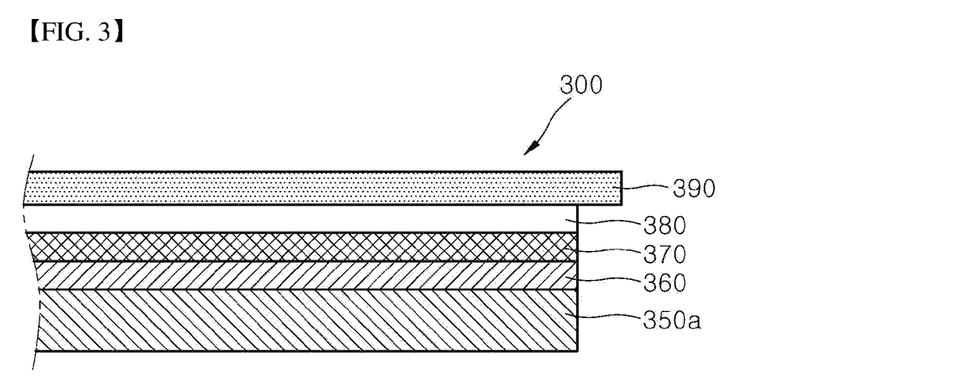
FIG. 3 is a sectional view of a flexible display device according to one embodiment of the present invention.
Figure 4:
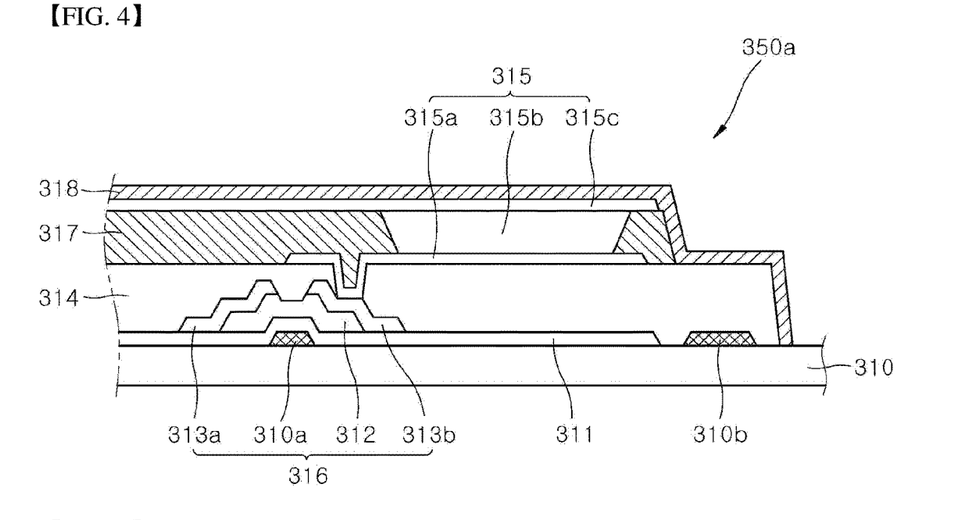
FIG. 4 is a sectional view of one embodiment of a display part shown in FIG. 3.

Next, a flexible display device according to one embodiment will be described with reference to FIG. 3 and FIG. 4. FIG. 3 is a sectional view of a flexible display device according to one embodiment of the present invention and FIG. 4 is a sectional view of one embodiment of a display part shown in FIG. 3.

Referring to FIG. 3, a flexible display device 300 according to one embodiment of the invention includes a display part 350a, an adhesive layer 360, a polarizing plate 370, a touchscreen panel 380, and a flexible window film 390, which may include the flexible window film according to the embodiments of the invention.

The display part 350a serves to drive the flexible display device 300 and may include a substrate and an optical device formed on the substrate and including an OLED, an LED or an LCD device. FIG. 4 is a sectional view of one embodiment of the display part shown in FIG. 3. Referring to FIG. 4, the display part 350a includes a lower substrate 310, a thin film transistor 316, an organic light emitting diode 315, a flattening layer 314, a protective layer 318, and an insulating layer 317.

The lower substrate 310 supports the display part 350a, and the thin film transistor 316 and the organic light emitting diode 315 may be formed on the lower substrate 310. The lower substrate 310 may be formed with a flexible printed circuit board (FPCB) for driving the touchscreen panel 380. The flexible printed circuit board may further include a timing controller, a power source, and the like in order to drive an array of organic light emitting diodes.

The lower substrate 310 may include a substrate formed of a flexible resin. Specifically, the lower substrate 310 may include a flexible substrate such as a silicone substrate, a polyimide substrate, a polycarbonate substrate, and a polyacrylate substrate, without being limited thereto.

In a display area of the lower substrate 310, plural pixel domains are defined by plural driving wires (not shown) and plural sensor wires (not shown) intersecting each other and each of the pixel domains may be formed with an array of organic light emitting diodes, each of which includes the thin film transistor 316 and the organic light emitting diode 315 connected to the thin film transistor 316. In a non-display area of the lower substrate, a gate driver applying electric signals to the driving wires may be formed in the form of a gate-in panel. The gate-in panel circuit may be formed at one or both sides of the display area.

The thin film transistor 316 controls electric current flowing through a semiconductor by application of an electric field perpendicular to the electric current and may be formed on the lower substrate 310. The thin film transistor 316 may include a gate electrode 310a, a gate insulation layer 311, a semiconductor layer 312, a source electrode 313a, and a drain electrode 313b. The thin film transistor 316 may be an oxide thin film transistor which uses an oxide such as indium gallium zinc oxide (IGZO), ZnO, or TiO as the semiconductor layer, an organic thin film transistor which uses an organic material as the semiconductor layer, an amorphous silicon thin film transistor which uses amorphous silicon as the semiconductor layer, or a polycrystalline silicon thin film transistor which uses polycrystalline silicon as the semiconductor layer.

The flattening layer 314 covers the thin film transistor 316 and a circuit section 310b to flatten upper surfaces of the thin film transistor 316 and the circuit section 310b such that the organic light emitting diode 315 can be formed thereon. The flattening layer 314 may be formed of a spin-on-glass (SOG) film, a polyimide polymer, or a polyacrylic polymer, without being limited thereto.

The organic light emitting diode 315 realizes a display through self-emission, and may include a first electrode 315*a*, an organic light-emitting layer 315*b*, and a second electrode 315*c*, which are stacked in the stated order. Adjacent organic light emitting diodes may be isolated from each other by the insulating layer 317. The organic light emitting diode 315 may have a bottom emission type structure wherein light generated from the organic light-emitting layer 315*b* is emitted through the lower substrate, or a top-emission type structure wherein light from the organic light-emitting layer 315*b* is emitted through an upper substrate.

The protective layer 318 covers the organic light emitting diodes to protect the organic light emitting diodes. The protective layer may be formed of an inorganic material such as SiOx, SiNx, SiC, SiON, SiONC, and amorphous carbon (a-C), or an organic material such as (meth)acrylates, epoxy polymers, imide polymers, and the like. Specifically, the protective layer may include an encapsulation layer in which an inorganic material layer and an organic material layer are sequentially stacked once or plural times.

Referring again to FIG. 3, the adhesive layer 360 attaches the display part 350*a* to the polarizing plate 370, and may be formed of an adhesive composition including a (meth) acrylate resin, a curing agent, an initiator, and a silane coupling agent.

The polarizing plate 370 can realize polarization of internal light or prevent reflection of external light to realize a display, or can increase contrast of the display. The polarizing plate may be composed of a polarizer alone. Alternatively, the polarizing plate may include a polarizer and a protective film formed on one or both surfaces thereof. Alternatively, the polarizing plate may include a polarizer and a protective coating layer formed on one or both surfaces thereof. As the polarizer, the protective film and the protective coating layer, a typical polarizer, a typical protective film and a typical protective coating layer known in the art may be used.

The touchscreen panel 380 generates electrical signals through detection of variation in capacitance when a human body or a conductor such as a stylus touches the touchscreen panel, and the display part 350*a* may be driven by such electrical signals. The touchscreen panel 380 is formed by patterning a flexible conductor, and may include first sensor electrodes and second sensor electrodes each formed between the first sensor electrodes and intersecting the first sensor electrodes. The touchscreen panel 380 may include a conductive material such as metal nanowires, conductive polymers, and carbon nanotubes, without being limited thereto.

The flexible window film 390 may be disposed as an outermost layer of the flexible display device 300 to protect the flexible display device.

Although not shown in FIG. 3, adhesive layers may be further formed between the polarizing plate 370 and the touchscreen panel 380 and/or between the touchscreen panel 380 and the flexible window film 390 to reinforce coupling between the polarizing plate, the touchscreen panel, and the flexible window film. The adhesive layers may be formed of an adhesive composition including a (meth)acrylate resin, a curing agent, an initiator, and a silane coupling agent. Although not shown in FIG. 3, a polarizing plate may be further disposed under the display part 350*a* to realize polarization of internal light.

Figure 5:
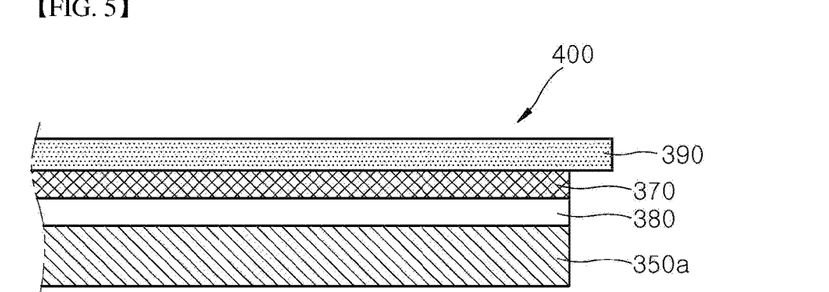
FIG. 5 is a sectional view of a flexible display device according to another embodiment of the present invention.

Next, a flexible display device according to another embodiment of the present invention will be described with reference to FIG. 5. FIG. 5 is a sectional view of a flexible display device according to another embodiment of the present invention.

Referring to FIG. 5, a flexible display device 400 according to another embodiment of the invention includes a display part 350*a*, a touchscreen panel 380, a polarizing plate 370, and a flexible window film 390, which may include the flexible window film according to the embodiments of the invention. The flexible display device according to this embodiment is substantially the same as the flexible display according to the above embodiment except that the touchscreen panel 380 is disposed under the polarizing plate 370 instead of being directly formed on the flexible window film 390. In addition, the touchscreen panel 380 may be formed together with the display part 350*a*. In this case, since the touchscreen panel 380 is formed together with the display part 350*a* on the display part 350*a*, the flexible display device according to this embodiment is thinner and brighter than the flexible display according to the above embodiment, thereby providing better visibility. Furthermore, the touchscreen panel 380 may be formed by deposition, without being limited thereto. Although not shown in FIG. 5, adhesive layers may be further formed between the display part 350*a* and the touchscreen panel 380, between the touchscreen panel 380 and the polarizing plate 370, and/or between the polarizing plate 370 and the flexible window film 390 to reinforce mechanical strength of the display. The adhesive layers may be formed of an adhesive composition including a (meth)acrylate resin, a curing agent, an initiator, and a silane coupling agent. Although not shown in FIG. 5, a polarizing plate may be further disposed under the display part 350*a* to provide a good display image through polarization of internal light.

Figure 6:
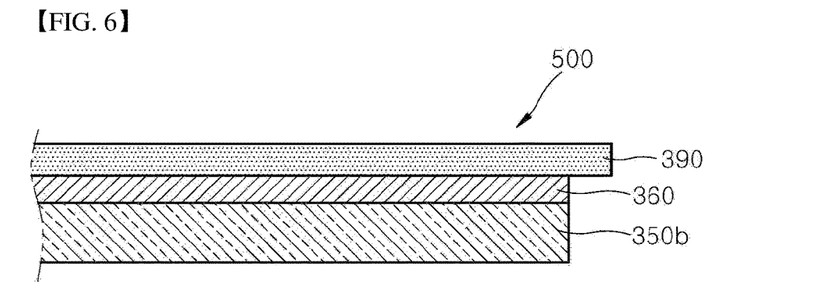
FIG. 6 is a sectional view of a flexible display device according to a further embodiment of the present invention.

Next, a flexible display device according to a further embodiment of the present invention will be described with reference to FIG. 6. FIG. 6 is a sectional view of a flexible display device according to a further embodiment of the present invention. Referring to FIG. 6, a flexible display device 500 according to a further embodiment of the invention includes a display part 350*b*, an adhesive layer 360, and a flexible window film 390, which may include the flexible window film according to the embodiments of the invention. The flexible display device according to this embodiment is substantially the same as the flexible display device according to the one embodiment except that the flexible display device can be driven by the display part 350*b* alone and the polarizing plate and the touchscreen panel are omitted.

The display part 350*a* may include a substrate and an optical device formed on the substrate and including an OLED, an LED or an LCD device. The display part 350*b* may further include a touchscreen panel therein.

Although the flexible window films according to the embodiments of the invention are described as being applied to a flexible display device, it should be understood that the flexible window films according to the embodiments of the invention may also be applied to a non-flexible display.

Hereinafter, the present invention will be described in more detail with reference to some examples. It should be understood that these examples are provided for illustration only and are not to be construed in any way as limiting the present invention.

Preparative Example 1: First Silicone Resin

A mixture of 1 mol of 2-(3,4-epoxycyclohexyl)ethyltrimethoxysilane (KBM-303, Shin-Etsu Chemicals Co., Ltd.) and 11.42 g of polydimethylsiloxane having a terminal hydroxyl group (DMS-S15, Gelest Co., Ltd.) was placed in a 1,000 ml 3-neck flask. The mixture was composed of 90 mol % of 2-(3,4-epoxycyclohexyl)ethyltrimethoxysilane and 10 mol % of polydimethylsiloxane having a terminal hydroxyl group. Relative to the amount of silicon, 0.5 mol % of KOH and 1.5 mol % of water were added to the mixture, followed by stirring at 65° C. for 2 hours, thereby preparing a silicone resin. The remaining solvent was removed using a vacuum distillation device and methylethylketone was added to the silicone resin to obtain 90 wt % of the silicone resin in terms of solid content. The silicone resin had a weight average molecular weight of 4,500, as measured by gel permeation chromatography.

Preparative Example 2: First Silicone Resin

A silicone resin was prepared in the same manner as in Preparative Example 1 except that a mixture of 1 mol of 2-(3,4-epoxycyclohexyl)ethyltrimethoxysilane and 25.69 g of polydimethylsiloxane having a terminal hydroxyl group was used. The mixture was composed of 80 mol % of 2-(3,4-epoxycyclohexyl)ethyltrimethoxysilane and 20 mol % of polydimethylsiloxane having a terminal hydroxyl group. The silicone resin had a weight average molecular weight of 5,300, as measured by gel permeation chromatography.

Preparative Example 3: First Silicone Resin

A silicone resin was prepared in the same manner as in Preparative Example 1 except that a mixture of 1 mol of 2-(3,4-epoxycyclohexyl)ethyltrimethoxysilane and 44.05 g of polydimethylsiloxane having a terminal hydroxyl group was used. The mixture was composed of 70 mol % of 2-(3,4-epoxycyclohexyl)ethyltrimethoxysilane and 30 mol % of polydimethylsiloxane having a terminal hydroxyl group. The silicone resin had a weight average molecular weight of 3,600, as measured by gel permeation chromatography.

Preparative Example 4: Silicone Resin

A silicone resin was prepared in the same manner as in Preparative Example 1 except that 100 mol % of 2-(3,4-epoxycyclohexyl)ethyltrimethoxysilane was used.

Preparative Example 5: Silicone Resin

A silicone resin was prepared in the same manner as in Preparative Preparative Example 1 except that 80 mol % of 2-(3,4-epoxycyclohexyl)ethyltrimethoxysilane and 20 mol % of dimethyldimethoxysilane (Aldrich) were used.

Preparative Example 6: Silicone Resin

A silicone resin was prepared in the same manner as in Preparative Example 1 except that a mixture of 1 mol of 2-(3,4-epoxycyclohexyl)ethyltrimethoxysilane and 190.86 g of polydimethylsiloxane having a terminal hydroxyl group was used. The mixture was composed of 35 mol % of 2-(3,4-epoxycyclohexyl)ethyltrimethoxysilane and 65 mol % of polydimethylsiloxane having a terminal hydroxyl group. The silicone resin had a weight average molecular weight of 3,500, as measured by gel permeation chromatography.

Preparative Example 7: Second Silicone Resin 12.42 g of a mixture of 90 mol % of hydride Q resin (HQM-107, Gelest Co., Ltd.) and 10 mol % of 4-vinyl-1-cyclohexene-1,2-epoxide (Aldrich) was added to toluene, followed by nitrogen purging. A platinum catalyst (PT-CS-1.8CS, Umicore Co., Ltd.) containing 300 ppm of platinum was added to the mixture. A second silicone resin containing a Q unit represented by Formula 5-1 was prepared through reaction of the mixture at 60° C. in a nitrogen atmosphere for 2 hours. The second silicone resin had a weight average molecular weight of 4,000, as measured by gel permeation chromatography.

<Formula 5-1>

(In Formula 5-1, * is a linking site of an element).

Preparative Example 8: Second Silicone Resin

A mixture comprising 60 mol % of 1,2-bis(triethoxysilyl)ethane and 40 mol % of 1,1,3,3-tetramethyldisiloxane (Gelest Co. Ltd.) was placed in a 1,000 ml 3-neck flask. 0.5 mol % of p-toluenesulfonic acid as an acid catalyst based on the amount of the mixture and 6 mol % of water based on the amount of the alkoxy group in the monomer mixture were added to the mixture. The resulting mixture was stirred at 40° C. for 12 hours, followed by removal of toluene using a vacuum distillation device and neutralization with distilled water. Water was removed from the mixture by adding magnesium sulfide. 1 mol % of 4-vinyl-1-cyclohexene-1,2-epoxide (Aldrich) was added to 100 mol % of the mixture, followed by nitrogen purging. A platinum catalyst (PT-CS-1.8CS, Umicore Co., Ltd.) containing 300 ppm of platinum was added to the mixture, which in turn was reacted at 60° C. in a nitrogen atmosphere for 2 hours, thereby preparing a second silicone resin containing a bridge unit represented by Formula 6-2. The second silicone resin had a weight average molecular weight of 3,600, as measured by gel permeation chromatography.

<Formula 6-2>

(in Formula 6-2, * is a linking site of an element).

Components of each of the silicone resins prepared in Preparative Example 1 to Preparative Example 8 are shown in Table 1.

TABLE 1

| Silicon monomer (mol %) | Preparative Example 1 | Preparative Example 2 | Preparative Example 3 | Preparative Example 4 | Preparative Example 5 | Preparative Example 6 | Preparative Example 7 | Preparative Example 8 |
|---|---|---|---|---|---|---|---|---|
| 2-(3,4-epoxycyclohexyl)ethyltrimethoxysilane | 90 | 80 | 70 | 100 | 80 | 35 | — | — |
| Polydimethyl siloxane | 10 | 20 | 30 | — | — | 65 | — | — |
| Dimethyldimethoxysilane | — | — | — | — | 20 | — | — | — |
| HQM-107 | — | — | — | — | — | — | 90 | — |
| 1,2-bis(triethoxysilyl)ethane | — | — | — | — | — | — | — | 60 |
| 1,1,3,3-tetramethyldisiloxane | — | — | — | — | — | — | — | 40 |
| 4-vinyl-1-cyclohexene-1,2-epoxide | — | — | — | — | — | — | 10 | 1 |
| Weight average molecular weight | 4,500 | 5,300 | 3,600 | 6,200 | 3,800 | 3,500 | 4,000 | 3,600 |

Example 1

A composition for window films was prepared by mixing 80 parts by weight of the first silicone resin prepared in Preparative Example 1, 5 parts by weight of the second silicone resin prepared in Preparative Example 7, 10 parts by weight of a crosslinking agent (CY-179, Ciba Chemicals Co., Ltd.), and 5 parts by weight of an initiator (Irgacure-250, BASF). The prepared composition was coated onto a polyethylene terephthalate film (TA043, Toyobo, thickness: 80 μm), followed by drying at 80° C. for 4 minutes, irradiation with UV light at 1,000 mJ/cm², and heating at 80° C. for 4 minutes, thereby preparing a window film having a 50 μm thick coating layer.

Examples 2 to 8

A window film was prepared in the same manner as in Example 1 except that the kind and amounts of the first silicone resin and the second silicone resin were changed as listed in Table 2.

Comparative Example 1

A composition for window films was prepared by mixing 85 parts by weight of the first silicone resin of Preparative Example 1, 10 parts by weight of a crosslinking agent (CY-179, Ciba Chemicals Co., Ltd.), and 5 parts by weight of an initiator (Irgacure-250, BASF). The prepared composition was coated onto a polyethylene terephthalate film (TA043, Toyobo, thickness: 80 μm), followed by drying at 80° C. for 4 minutes, irradiation with UV light at 1,000 mJ/cm², and heating at 80° C. for 4 minutes, thereby preparing a window film having a 50 μm thick coating layer.

Comparative Examples 2 to 6

Window films were prepared in the same manner as in Comparative Example 1 except that the composition for window films was changed as listed in Table 3.

The window films prepared in Examples and Comparative Examples were evaluated as to Properties (1) to (4) and evaluation results are shown in Tables 2 and 3.

(1) Pencil hardness: Pencil hardness was measured on a coating layer of a window film using a pencil hardness tester (Heidon) in accordance with JIS K5400. Pencil hardness was measured using pencils of 6B to 9H (Mitsubishi Co., Ltd.) under conditions of a pencil load of 1 kg on the coating layer, a scratch angle of 45, and a scratch speed of 60 mm/min. When the coating layer had one or more scratches after being tested 5 times using a certain pencil, pencil hardness was measured again using another pencil having one-level lower pencil hardness than the previous pencil. A pencil hardness value allowing no scratch to be observed all five times on the coating layer was taken as pencil hardness of the coating layer.

(2) Radius of curvature: A window film (width×length×thickness, 3 cm×15 cm×130 μm, base layer thickness: 80 μm, coating layer thickness: 50 μm) was wound around a jig for measuring a radius of curvature, kept wound for 5 seconds or more, unwound, and then observed with the naked eye to determine whether the window film had cracks. Here, a radius of curvature in the compressive direction was measured by winding the window film around the jig such that the coating layer of the window film contacted the jig, and a radius of curvature in the tensile direction was measured by winding the window film around the jig such that the base layer of the window film contacted the jig. The radius of curvature was determined by a minimum radius of a jig causing no cracks on the window film, as measured in the compression direction while gradually decreasing the diameters of jigs from a jig having the maximum diameter.

(3) Curling: Referring to FIG. 7, a window film 1 including an 80 μm thick base layer and a 50 μm thick coating layer was cut to a size of 10 cm×10 cm and placed on a floor surface 2. Then, the window film was left at 25° C. and at 40% RH. Thereafter, a maximum height H from the floor surface 2 to an edge of the window film 1 was measured and averaged.

(4) Appearance: When observed with the naked eye, generation of no pinholes and wrinkles on a coating layer of a window film was rated as pass and generation of pinholes and wrinkles was rated as fail.

TABLE 2

|  |  | Example | | | | | | | |
|---|---|---|---|---|---|---|---|---|---|
|  |  | 1 | 2 | 3 | 4 | 5 | 6 | 7 | 8 |
| First silicone resin (parts by weight) | Preparative Example 1 | 80 | 75 | 80 | 75 | — | — | — | — |
|  | Preparative Example 2 | — | — | — | — | 80 | 75 | — | — |
|  | Preparative Example 3 | — | — | — | — | — | — | 80 | 75 |
| Second silicone resin (parts by weight) | Preparative Example 7 | 5 | 10 | — | — | 5 | 10 | 5 | 10 |
|  | Preparative Example 8 | — | — | 5 | 10 | — | — | — | — |
| Crosslinking agent (CY-179) (parts by weight) |  | 10 | 10 | 10 | 10 | 10 | 10 | 10 | 10 |
| Initiator (parts by weight) |  | 5 | 5 | 5 | 5 | 5 | 5 | 5 | 5 |
| Pencil hardness |  | 7H | 8H | 7H | 8H | 7H | 8H | 7H | 7H |
| Radius of curvature (mm) |  | 3.5 | 3.5 | 4 | 4 | 2.5 | 2.5 | 2.0 | 2.0 |
| Curl (mm) |  | 1.2 | 1 | 1.5 | 2.0 | 3.0 | 3.2 | 2.5 | 2.8 |
| Appearance |  | Pass | Pass | Pass | Pass | Pass | Pass | Pass | Pass |

TABLE 3

|  |  | Comparative Example | | | | | |
|---|---|---|---|---|---|---|---|
|  |  | 1 | 2 | 3 | 4 | 5 | 6 |
| First silicone resin (parts by weight) | Preparative Example 1 | 85 | — | — | — | — | — |
|  | Preparative Example 2 | — | 85 | — | — | — | — |
|  | Preparative Example 3 | — | — | 85 | — | — | — |
| Silicone resin (parts by weight) | Preparative Example 4 | — | — | — | 85 | — | — |
|  | Preparative Example 5 | — | — | — | — | 85 | — |
|  | Preparative Example 6 | — | — | — | — | — | 75 |
| Second silicone resin (parts by weight) | Preparative Example 7 | — | — | — | — | — | 10 |
|  | Preparative Example 8 | — | — | — | — | — | — |
| Crosslinking agent (CY-179) (parts by weight) |  | 10 | 10 | 10 | 10 | 10 | 10 |
| Initiator (parts by weight) |  | 5 | 5 | 5 | 5 | 5 | 5 |
| Pencil hardness |  | 4H | 4H | 3H | 5H | 4H | 2H |
| Radius of curvature (mm) |  | 3.7 | 2.7 | 2.0 | 5.9 | 4.2 | 2.8 |
| Curl (mm) |  | 2.5 | 3.2 | 3.9 | 1.7 | 5.6 | 4.5 |
| Appearance |  | Pass | Pass | Pass | Pass | Fail | Fail |

As shown in Table 2, the flexible window films according to the present invention had a pencil hardness of 7H or higher indicating good hardness, a radius of curvature of 5.0 mm or less indicating good flexibility, good appearance, and low curling, and thus could be used as a flexible window film.

On the contrary, as shown in Table 3, the flexible window films of Comparative Examples 1 to 3, which were prepared without using the second silicone resin, had poorer pencil hardness than the flexible window films according to the present invention. The flexible window films of Comparative Examples 1 to 3, which did not include both the first silicone resin and the second silicone resin, exhibited poor properties in terms of at least one of pencil hardness, radius of curvature, curling and appearance. The flexible window film of Comparative Example 6, in which the content of ($[R^2R^3SiO_{2/2}]_n$) was out of the range of the present invention, had poor pencil hardness and appearance.

It should be understood that various modifications, changes, alterations, and equivalent embodiments can be made by those skilled in the art without departing from the spirit and scope of the invention.

The invention claimed is:

1. A composition for window films, comprising: a first silicone resin represented by Formula 1; a second silicone resin containing a crosslinkable functional group and at least one of a Q unit and a bridge unit; a crosslinking agent; and an initiator:

<Formula 1> where $R^1$ is a crosslinkable functional group;

$R^2$ and $R^3$ are each independently a methyl group;

$R^4$ and $R^5$ are each independently hydrogen, a crosslinkable functional group, an unsubstituted or substituted $C_1$ to $C_{20}$ alkyl group, or an unsubstituted or substituted $C_5$ to $C_{20}$ cycloalkyl group;

$R^6$, $R^7$ and $R^8$ are each independently hydrogen, a crosslinkable functional group, an unsubstituted or substituted $C_1$ to $C_{20}$ alkyl group, an unsubstituted or substituted $C_5$ to $C_{20}$ cycloalkyl group, or an unsubstituted or substituted $C_6$ to $C_{30}$ aryl group;

n is an integer of 7 to 100; and $0<x<1$, $0.01 \leq z \leq 0.6$, $0 \leq z<1$, $0 \leq w \leq 0.05$, and $x+y+z+w=1$.

2. The composition for window films according to claim 1, wherein the first silicone resin is represented by at least one of compounds represented by Formula 1-1A to Formula 1-1C:

<Formula 1-1A>

<Formula 1-1B>

<Formula 1-1C> where in Formula 1-1A to Formula 1-1C, Ec is an epoxycyclohexylethyl group, Gp is a glycidoxypropyl group, Op is an oxetanylpropyl group, Me is a methyl group, n is the same as defined in Formula 1, $0.4 \leq x \leq 0.99$, $0.01 \leq 0.6$, and $x+y=1$.

3. The composition for window films according to claim 1, wherein the first silicone resin is present in an amount of about 30 wt % to about 99 wt % in the composition for window films in terms of solid content.

4. A composition for window films, comprising: a first silicone resin represented by Formula 1; a second silicone resin containing a crosslinkable functional group and at least one of a Q unit and a bridge unit; a crosslinking agent; and an initiator:

<Formula 1> where $R^1$ is a crosslinkable functional group;

$R^2$ and $R^3$ are each independently a methyl group;

$R^4$ and $R^5$ are each independently hydrogen, a crosslinkable functional group, an unsubstituted or substituted $C_1$ to $C_{20}$ alkyl group, or an unsubstituted or substituted $C_5$ to $C_{20}$ cycloalkyl group;

$R^6$, $R^7$ and $R^8$ are each independently hydrogen, a crosslinkable functional group, an unsubstituted or substituted $C_1$ to $C_{20}$ alkyl group, an unsubstituted or substituted $C_5$ to $C_{20}$ cycloalkyl group, or an unsubstituted or substituted $C_6$ to $C_{30}$ aryl group;

n is an integer of 7 to 100; and $0<x<1$, $0.01 \leq y \leq 0.6$, $0 \leq z<1$, $0 \leq w<1$, and $x+y+z+w=1$, wherein the second silicone resin comprises at least one of compounds represented by Formula 5 and Formula 6:

<Formula 5> where in Formula 5, * is a linking site of an element;

$R^{14}$, $R^{15}$, $R^{16}$, $R^{17}$, $R^{18}$ and $R^{19}$ are each independently a crosslinkable functional group, or a substituted or unsubstituted $C_1$ to $C_{10}$ alkyl group; and n is an integer of 10 to 200, <Formula 6> where in Formula 6, * is a linking site of an element;

$R^{20}$ is a substituted or unsubstituted $C_1$ to $C_{20}$ alkylene group, a substituted or unsubstituted $C_2$ to $C_{20}$ alkenylene group, a substituted or unsubstituted $C_2$ to $C_{20}$ alkynylene group, a substituted or unsubstituted $C_6$ to $C_{20}$ arylene group, a substituted or unsubstituted $C_7$ to $C_{30}$ arylalkylene group, or a substituted or unsubstituted $C_3$ to $C_{20}$ cycloalkylene group;

$R^{14}$, $R^{15}$, $R^{16}$, $R^{17}$, $R^{18}$ and $R^{19}$ are the same as defined in Formula 5; and n is an integer of 15 to 120.

5. A composition for window films, comprising: a first silicone resin represented by Formula 1; a second silicone resin containing a crosslinkable functional group and at least one of a Q unit and a bridge unit; a crosslinking agent; and an initiator:

<Formula 1> where $R^1$ is a crosslinkable functional group;

$R^2$ and $R^3$ are each independently a methyl group;

$R^4$ and $R^5$ are each independently hydrogen, a crosslinkable functional group, an unsubstituted or substituted $C_1$ to $C_{20}$ alkyl group, or an unsubstituted or substituted $C_5$ to $C_{20}$ cycloalkyl group;

$R^6$, $R^7$ and $R^8$ are each independently hydrogen, a crosslinkable functional group, an unsubstituted or substituted $C_1$ to $C_{20}$ alkyl group, an unsubstituted or substituted $C_5$ to $C_{20}$ cycloalkyl group, or an unsubstituted or substituted $C_6$ to $C_{30}$ aryl group;

n is an integer of 7 to 100; and $0<x<1$, $0.01 \leq y \leq 0.6$, $0 \leq z<1$, $0 \leq w<1$, and $x+y+z+w=1$, wherein the second silicone resin comprises at least one of compounds represented by Formula 5-1, Formula 5-2, Formula 6-1, and Formula 6-2:

<Formula 5-1>

<Formula 5-2> where in Formula 5-1 and Formula 5-2, * is a linking site of an element and n is an integer of 10 to 200, <Formula 6-1>

<Formula 6-2> where in Formula 6-1 and Formula 6-2, * is a linking site of an element and n is an integer of 15 to 120.

6. The composition for window films according to claim 1, wherein the second silicone resin is present in an amount of about 0.1 wt % to about 50 wt % in the composition for window films in terms of solid content.

7. A flexible window film comprising a base layer and a coating layer formed on one surface of the base layer, wherein the coating layer is formed of the composition for window films according to claim 1.

8. The flexible window film according to claim 7, further comprising: an adhesive layer formed on an other surface of the base layer opposite to the one surface.

9. A flexible display device comprising the flexible window film according to claim 7.

10. The flexible display device according to claim 9, comprising: a display part; an adhesive layer formed on the display part; a polarizing plate formed on the adhesive layer; a touchscreen panel formed on the polarizing plate; and the flexible window film formed on the touchscreen panel.

11. The flexible display device according to claim 9, comprising: a display part; a touchscreen panel formed on the display part; a polarizing plate formed on the touchscreen panel; and the flexible window film formed on the polarizing plate.

12. The flexible display device according to claim 9, comprising: a display part; an adhesive layer formed on the display part; and the flexible window film formed on the adhesive layer.

13. The flexible display device according to claim 12, further comprising: a polarizing plate disposed at an upper or lower side of the display part.

* * * * *

UNITED STATES PATENT AND TRADEMARK OFFICE
CERTIFICATE OF CORRECTION

PATENT NO. : 10,513,631 B2  
APPLICATION NO. : 15/561945  
DATED : December 24, 2019  
INVENTOR(S) : Dong Il Han et al.

Page 1 of 1

It is certified that error appears in the above-identified patent and that said Letters Patent is hereby corrected as shown below:

In the Claims

Column 25, Line 24 (approx.), Claim 1 delete "0.01≤0.6," and insert -- $0.01 \leq y \leq 0.6$, --

Column 25, Line 40 (approx.), Claim 2 delete "0.010.6," and insert -- $0.01 \leq y \leq 0.06$, --

Signed and Sealed this
Tenth Day of November, 2020

Andrei Iancu
*Director of the United States Patent and Trademark Office*